Oct. 24, 1939. C. W. HANSELL Re. 21,246

FILTER

Original Filed July 7, 1927

INVENTOR
CLARENCE W. HANSELL
BY Frad Adams
ATTORNEY

Reissued Oct. 24, 1939

Re. 21,246

UNITED STATES PATENT OFFICE 21,246

FILTER

Clarence W. Hansell, Port Jefferson, N. Y., assignor to Radio Corporation of America, a corporation of Delaware Original No. 2,005,083, dated June 18, 1935, Serial No. 203,901, July 7, 1927. Application for reissue June 18, 1937, Serial No. 148,984

23 Claims. (Cl. 178—44)

This invention relates to filters for discriminating between energies of different frequencies, and more particularly to filters for selecting desired frequencies from undesired frequencies when the difference is very small relative to the frequencies involved.

In employing high frequency carrier waves for communication purposes there frequently arise situations where it is desirable to discriminate between frequencies, and filters have assumed great importance. For example, it is often desired after modulation to suppress a carrier and to utilize only one of the two side bands resulting from modulation of the carrier. When very high carrier frequencies are employed the percentage difference between the two side bands is exceedingly small, and separation becomes difficult. It is an object of my invention to provide a highly selective filter, and this I do by employing a piezo-electric crystal having a resonance frequency equal to the desired frequency.

Owing to the fact that the crystal and its holder form a condenser through the capacitance of which frequencies may be transferred which differ from the resonance frequency of the crystal it is desirable to so arrange the filter circuits that the capacitance of the crystal and crystal holder is neutralized, and to do this is a further object of my invention. The crystal is mounted in one arm of a symmetrical impedance bridge, and the input and output circuits of the filter are connected to different pairs of opposite corners of the bridge, thus obviating any coupling between the input and output circuits by reason of the capacitance of the crystal and its holder.

Because its resonance curve is exceedingly sharply defined a crystal filter may be too selective for many purposes. To fulfill the need for a band filter, rather than a single frequency filter, while retaining the advantages of a crystal filter, is a still further object of my invention. The widening of the filter characteristic may be accomplished in a number of ways, and in some cases it proves preferable to use a combination of methods. One method is to employ a plurality of crystals of different adjacent resonance frequencies distributed over the desired frequency band and connected electrically in parallel. In this manner the frequency selection may be widened from a sharp peak to a well-defined band, the width of which will depend upon the range of frequency of the various crystals employed.

Another expedient for broadening the filter characteristic is the use of a parallel resonant circuit shunted across the output circuit of the crystal. In such case, in effect, the crystal filter may be compared to a single section of a Campbell band filter, wherein the series resonant circuit has been replaced by the crystal. The crystal filter has the advantage of being so sharply selective that the necessity for more than a single section probably will never arise.

The invention is described more completely in the following specification, which is accompanied by a drawing in which Figure 1 is a wiring diagram for a simple form of crystal filter;

Figure 1:
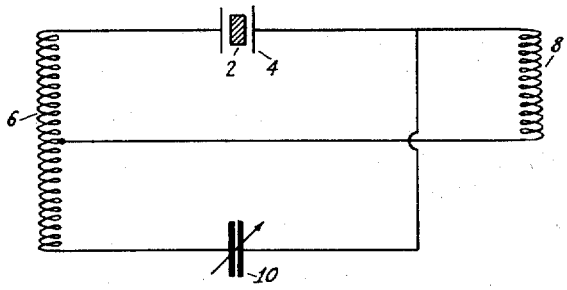

Referring to Figure 1, a crystal 2 is placed between the electrodes of a crystal holder 4 which is series connected between an input coil 6 and an output coil 8. For neutralization, either the input or output coil may be divided and a neutralizing condenser 10 connected in circuit as shown in Figure 1. The filter will, of course, work equally well in both directions, and therefore the coil 8 may be used as an input circuit and the coil 6 as an output circuit. In the simplest case the coil 6 is divided into two equal parts and the condenser 10 is made equal in capacitance to the crystal and its holder.

Figure 2:
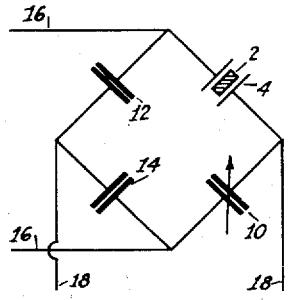
Figure 2 is a modification of Figure 1 rearranged in the form of a bridge.

From a more general aspect the circuits need not necessarily be inductively coupled, for in some cases capacitive coupling may work equally well, and Figure 2 is included to show the more general case of a reactance bridge comprising a crystal and holder 2, 4 in one arm of a bridge, a condenser 10 in another arm, and reactances 12 and 14 constituting the remaining arms of the bridge. The circuits 16 and 18 may be the input and output circuits, or vice versa. The reactances 12 and 14 may be capacitive or inductive, and equal or unequal, provided that the bridge is brought to symmetry by proper adjustment of the condenser 10. The circuits 16 and 18 cannot interact with respect to energy transferred thru the capacitance of the crystal and its holder because of the symmetrical coupling of the input and output circuits to the bridge, but it is only with respect to such capacitively transferred energy that the circuits are symmetrical. For energy transferred through the crystal 2 by resonance there is no opposing energy transferred through the condenser 10, and therefore the circuits 16 and 18 are operatively coupled together for energy of resonance frequency.

Figure 3:
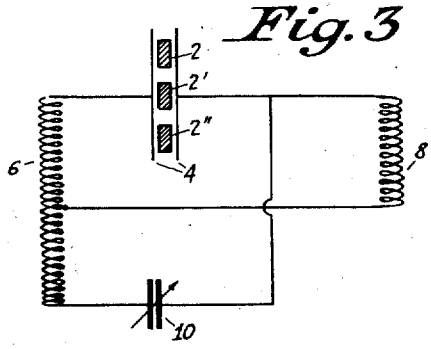
Figure 3 shows the use of a plurality of crystals.

In Figure 3 the arrangement is much like that shown in Figure 1 with the exception that in this case a plurality of crystals 2, 2', 2'' are shown between the electrodes of the crystal holder 4. As is schematically indicated in the figure, the plurality of crystals may be situated between the single pair of electrodes of one crystal holder, or there may equally well be employed a plurality of separate crystals and crystal holders electrically connected in parallel, as indicated in Figure 7.

Figure 4:
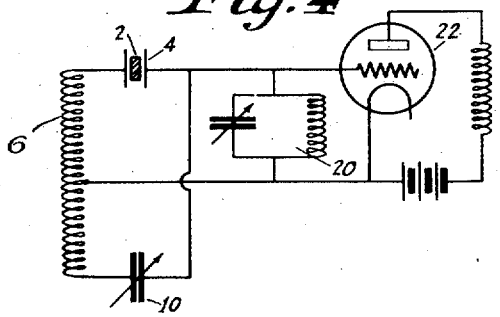
Figure 4 is a wiring diagram for a modification employing a parallel resonant output circuit.

In Figure 4 there is a crystal and holder 2, 4, a divided input coil 6, a neutralizing condenser 10, and across the output circuit there is connected a parallel resonant circuit 20. The output circuit in this case is shown connected to the grid and cathode of an amplifying tube 22, but this is not material to the present invention and has been included only to show that the output circuit need not necessarily be coupled to a next succeeding circuit by means of transformer coupling. The parallel resonant circuit 20 serves to broaden out the resonance curve of the filter.

Figure 5:
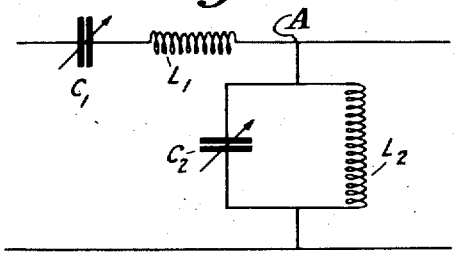
Figure 5 is explanatory of Figure 4.
Figure 6:
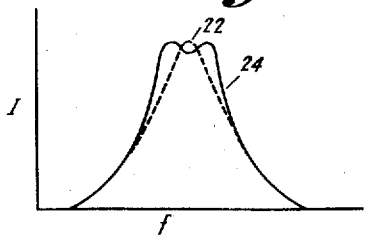
Figure 6 is a resonance curve for the modification shown in Figure 4.

The action of the circuit 20 in Figure 4 may be explained with the aid of the circuit shown in Figure 5, wherein a series resonant circuit $C_1$ $L_1$ has been substituted for the crystal 2. For the resonance frequency energy freely traverses the series resonant circuit $C_1$ $L_1$, and is blocked by the parallel resonan circuit $C_2$ $L_2$. For a frequency slightly above resonance the series resonant circuit becomes predominantly inductive and the parallel resonant circuit becomes predominantly capacitive, thus tending to create series resonance in $C_1$ $L_1$ $C_2$ $L_2$, accompanied by a current flow which tends to raise the potential at the point A. On the other hand, for a frequency slightly below resonance the series resonant circuit becomes predominantly capacitive, the parallel resonant circuit becomes predominantly inductive, again tending to create series resonance, and so raising the potential at the point A. In consequence a resonance curve such as 22, in Figure 6, is changed to a resonance curve like that numbered 24.

Figure 7:
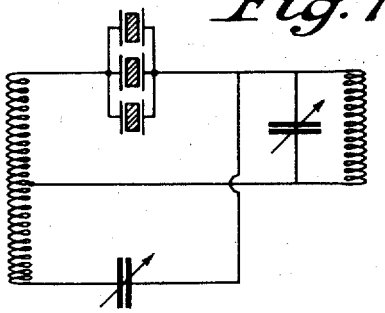
Figure 7 is an arrangement which is a combination of Figures 3 and 4.

In Figure 7 there is suggested a crystal filter for the selection of a frequency band governed by the use of both a plurality of parallel connected crystals and a parallel resonant output circuit. The combined circuit has certain advantages not found in the individual circuits, for the reason that by using the parallel resonant output circuit, as well as the plurality of crystals, the crest of the band filter curve may be smoothed out.

While one of the important advantages of the crystal filter is the great selectivity of only a single section, there may be used if necessary, a plurality of sections in concatenation. It is also clear that the circuit shown in Figure 1 may be connected across a circuit, instead of in series with a circuit, in order to eliminate an undesired frequency, the neutralization serving to prevent the elimination of other frequencies through the natural capacitance of the crystal and its holder.

I claim:

1. A band pass filter comprising, a plurality of piezo-electric crystals electrically connected in parallel and having different adjacent resonance frequencies, and means for neutralizing the inter-electrode capacity of the crystals.

2. In combination, an input circuit containing a plurality of frequencies, an output circuit, and interposed between said input and output circuits a band pass filter comprising a pair of electrodes and a plurality of piezo-electric crystals situated between said electrodes and having different, adjacent, resonant frequencies, each crystal having a surface adjacent each electrode whereby a band of frequencies is passed to said output.

3. A crystal band filter comprising an input circuit including an input coupling reactance, an output circuit including an output coupling reactance, and means coupling said circuits including a plurality of parallel connected piezo-electric crystals of different resonance frequencies distributed over the desired frequency band for passing a band of frequencies from said input to said output.

4. A crystal band filter comprising an input circuit, an output circuit, means coupling said circuits including a plurality of parallel connected piezo-electric crystals having different resonance frequencies distributed over the desired frequency band, and means to neutralize the effect of the capacitance of said crystals and their electrodes.

5. A crystal band filter comprising an input circuit, a parallel resonant output circuit, and means coupling them including a plurality of piezo-electric crystals whereby a predetermined band of frequencies are transmitted by the filter having different adjacent resonance frequencies for passing from said input to said output a band of frequencies.

6. A crystal band filter comprising an input circuit, a parallel resonant output circuit, and means coupling said circuits including a plurality of parallel connected piezo-electric crystals having different adjacent resonance frequencies for passing a band of frequencies from said input to said output.

7. A crystal band filter comprising an input circuit, a parallel resonant output circuit, means coupling said circuits including a plurality of parallel connected piezo-electric crystals having different adjacent resonance frequencies, electrodes for said crystals, and means to neutralize the effect of the capacitance of said crystals and electrodes.

8. In electrical apparatus, a bridge circuit having a condenser in each of three arms of the bridge and a piezo-electric crystal and its associated electrodes connected in the fourth arm of the bridge, and, input and output circuits across opposite corners of the bridge.

9. A band pass filter comprising a plurality of piezo-electric crystals electrically connected in parallel and having different resonance frequencies, each crystal passing currents of frequencies within a narrow portion of said band, the portions of said band passed by the various crystals being adjacent and overlapping each other, and means for neutralizing the inter-electrode capacity of said crystals.

10. A crystal filter comprising a symmetrical bridge having four arms, a piezo-electric crystal in one of said arms, and a capacitance in each of said other arms, at least one of said capacitances being variable for neutralizing the capacity on said crystal and for enabling adjustment of said bridge.

11. An electric wave filter of variable pass-band width having a piezo-electric crystal for determining the minimum width of the frequency band passed by the filter, adjustable impedance means for variably increasing the width of the band over a substantially wider range, the maximum value of said adjustable impedance means being substantially greater than the impedance of the crystal at resonance, and variable means for neutralizing the capacity of said crystal, said first means having output terminals.

12. An electric wave filter of variable pass-band width having a piezo-electric crystal for determining the minimum width of the frequency band passed by the filter, and means comprising a circuit including a variable impedance in series with said crystal for increasing the width of the band over a substantially wider range at the will of the operator, the maximum value of impedance of said circuit being substantially greater than the impedance of said crystal at resonance, and variable means for neutralizing the capacity of said crystal.

13. An electric wave filter of variable pass-band width having a piezo-electric crystal for determining the minimum width of the frequency band passed by the filter, means for variably increasing the width of the pass band, and variable means for neutralizing the capacity of said crystal.

14. An electric wave filter of variable pass-band width having a piezo-electric crystal for determining the minimum width of the frequency band passed by the filter, means for variably increasing the width of the pass band comprising means for introducing in series with said crystal a variable impedance having a variable resistance component which is appreciably larger than the impedance of said crystal at resonance, and variable means for neutralizing the capacity of said crystal.

15. A crystal band-pass filter comprising a symmetrical bridge having four arms, a piezo-electric crystal in one of said arms, and a reactance in each of said other arms, at least one of said reactances being a capacitance, said capacitance being variable for neutralizing the capacity on said crystal and for enabling adjustment of said bridge, and means for variably increasing the band width of the filter over a substantially wider range comprising a circuit whose impedance is substantially greater than the impedance of said crystal at resonance.

16. A crystal band-pass filter comprising a piezo-electric crystal, means comprising a parallel resonant circuit connected thereto for variably adjusting the width of the band of said filter, and a variable condenser for neutralizing the capacity of said crystal, the maximum value of the impedance of said parallel resonant circuit being substantially greater than the impedance of said crystal at resonance.

17. An electric wave filter comprising an input circuit, an output circuit, circuit means comprising a piezo-electric substance for electromechanically coupling said input and an output circuit including a variable impedance circuit in series with said substance for varying the frequency band width of the filter, the maximum value of said variable impedance circuit being substantially greater than the impedance of said crystal at resonance, and means for neutralizing the capacity of said piezo-electric substance.

18. An electric wave filter of variable pass-band width having a piezo-electric crystal for determining the minimum width of the frequency band passed by the filter, means for increasing the width of the band over a substantially wider range at the will of the operator, and means comprising a variable reactance for applying to the crystal circuit a voltage of controllable phase and value.

19. An electric wave filter of variable pass-band width having a piezo-electric crystal for determining the minimum width of the frequency band passed by the filter, means comprising a circuit including a variable impedance in series with said crystal for increasing the width of the band over a substantially wide range at the will of the operator, and means for applying to the crystal circuit a voltage of controllable phase and value.

20. In a wave communication system, the method of discriminating between a band of signals and undesired signal waves, which comprises selecting from the incoming signal energy the energy which is mainly of the frequencies of said band, separating a relatively small amount of the total incoming signal energy and combining said small amount of energy in phase opposition with the said selected signal energy.

21. A crystal band-pass filter comprising a symmetrical bridge having four arms, a piezo-electric crystal in one of said arms, and a reactance in each of said other arms, at least one of said reactances being a capacitance, said capacitance being variable for neutralizing the capacity on said crystal and for enabling adjustment of said bridge, and means for variably increasing the band width of the filter over a substantially wider range, said means comprising an inductance and a variable capacitor in parallel to said inductance, said capacitor having such a value and such a range of adjustment as to vary the band width of the filter.

22. In combination, a series circuit comprising a source of voltage, a piezo-electric crystal and a parallel tuned circuit, and a potential operated utilization circuit connected across parallel tuned circuit, the impedance of said parallel tuned circuit when adjusted to the natural frequency of said crystal being large compared to the series resistance of said crystal at its natural frequency, whereby the ratio of the voltage across the parallel tuned circuit to the voltage of said source is close to unity over the range of frequencies throughout which the aforesaid impedance holds true.

23. In combination, a series circuit comprising a source of voltage, a piezo-electric crystal and a parallel tuned circuit, and a potential operated utilization circuit connected across parallel tuned circuit, the impedance of said parallel tuned circuit when adjusted to the natural frequency of said crystal being large compared to the series resistance of said crystal at its natural frequency, whereby the ratio of the voltage across the parallel tuned circuit to the voltage of said source is close to unity over the range of frequencies throughout which the aforesaid impedance holds true, and means for reducing the range of frequencies over which said impedance relation holds true.

CLARENCE W. HANSELL.